United States Patent
Yeh

(10) Patent No.: US 7,353,591 B2
(45) Date of Patent: Apr. 8, 2008

(54) METHOD OF MANUFACTURING CORELESS SUBSTRATE

(75) Inventor: Tso-Hung Yeh, Yung-Ho (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 109 days.

(21) Appl. No.: 11/379,059

(22) Filed: Apr. 18, 2006

(65) Prior Publication Data

US 2007/0245551 A1   Oct. 25, 2007

(51) Int. Cl.
*H05K 3/36* (2006.01)

(52) U.S. Cl. .................... 29/830; 29/829; 29/831; 257/778

(58) Field of Classification Search ............ 29/829, 29/830, 831, 846, 847, 849, 852; 247/778, 247/783, 698
See application file for complete search history.

(56) References Cited

U.S. PATENT DOCUMENTS

| | | | |
|---|---|---|---|
| 6,696,764 B2* | 2/2004 | Honda | 257/778 |
| 7,093,356 B2* | 8/2006 | Imafuji et al. | 29/847 |
| 7,222,421 B2* | 5/2007 | Nakamura | 29/830 |
| 2005/0095748 A1* | 5/2005 | Schulz-Harder | 438/107 |
| 2005/0155222 A1* | 7/2005 | Nakamura | 29/830 |
| 2007/0074902 A1* | 4/2007 | Hirata | 174/262 |
| 2007/0130762 A1* | 6/2007 | Nakamura | 29/830 |

* cited by examiner

*Primary Examiner*—Terrence R. Till
*Assistant Examiner*—Jossef Zilberman

(57) ABSTRACT

A method for manufacturing coreless substrates is provided herein. The method first provides a base whose top and bottom sides are covered with metal layers respectively that are detachable from the base. From the two metal layers, the method then develops the bump-pad side or ball side wiring layers required by the coreless substrate simultaneously. The two metal layers along with their respective wiring layers are then separated from the base into two independent semi-products of the coreless substrate. The method then develops from the other sides of the two semi-products the laminate side wiring layers required by the coreless substrate.

4 Claims, 6 Drawing Sheets

METHOD OF MANUFACTURING CORELESS SUBSTRATE

FIELD OF THE INVENTION

The present invention generally relates to IC packaging, and more particularly to a method of manufacturing coreless substrates for IC packaging.

BACKGROUND OF THE INVENTION

The IC packaging is for protecting dies and providing an interface for the communications between the dies and the external circuitry. As electronic devices are continuously driven for smaller dimension and lighter weight, IC packaging is also required to be even more compact and to have higher layout density. To meet these requirements, numerous new technologies of IC packaging are proposed.

Conventional substrates for IC packaging (hereinafter, packaging substrates) are fabricated by directly forming a wiring layer on a CCL (copper coated laminate) base which is made by pressing a copper foil onto a resin core layer. Due to the constraints of the vias (i.e., through holes) and the thickness of the copper foil, CCL-based packaging substrates cannot offer the thickness and layout density required by recent IC packaging applications.

Currently, a number of methods such as Build Up and Semi-Additive Process (SAP) have been utilized to increase the layout density by forming multiple wiring layers on both sides of a core layer of the packaging substrate. However, vias are still required in providing electrical connection between the wiring layers (i.e., interlayer connection) on the core layer's two sides and, therefore, signal interference is inevitable. Also, when only one side of the packaging substrate requires high layout density, using Build Up method adds unnecessary cost and substrate thickness by having multiple wiring layers on the other side of the core layer as well.

Therefore, to increase the layout density and the quality of the electrical signal for packaging substrates so as to meet market demands, the so-called coreless substrate is proposed, which removes the thick core layer and uses blind vias for interlayer connection. In addition, coreless substrate is actually a flexible printed circuit board (PCB) and it can be manufactured using conventional equipments for regular PCB. Therefore, coreless substrate allows manufacturers to make flexible PCBs without additional investment in purchasing equipments specifically for flexible PCBs.

SUMMARY OF THE INVENTION

The present invention provides a method for manufacturing coreless substrates. Basically, the method conducts the process of building up wiring layers to both sides of a base simultaneously. After wiring layers on both sides of the base are built, they are removed from the base to become two independent semi-products. The semi-products are then put through the subsequent processes to make them into two coreless substrates. This method not only achieves the fabrication of coreless substrates, but also can double the production capacity.

More specifically, the method first provides a base whose top and bottom sides are covered with metal layers respectively that are detachable from the base. From the two metal layers, the method then develops the bump-pad side or ball side wiring layers required by the coreless substrate simultaneously. The two metal layers along with their respective wiring layers are then separated from the base into two independent semi-products of the coreless substrate. The method then develops from the other sides of the two semi-products the laminate side wiring layers required by the coreless substrate. As such, two coreless substrates are manufactured with a single process.

The foregoing and other objects, features, aspects and advantages of the present invention will become better understood from a careful reading of a detailed description provided herein below with appropriate reference to the accompanying drawings.

DETAILED DESCRIPTION OF THE INVENTION

Figure 1:
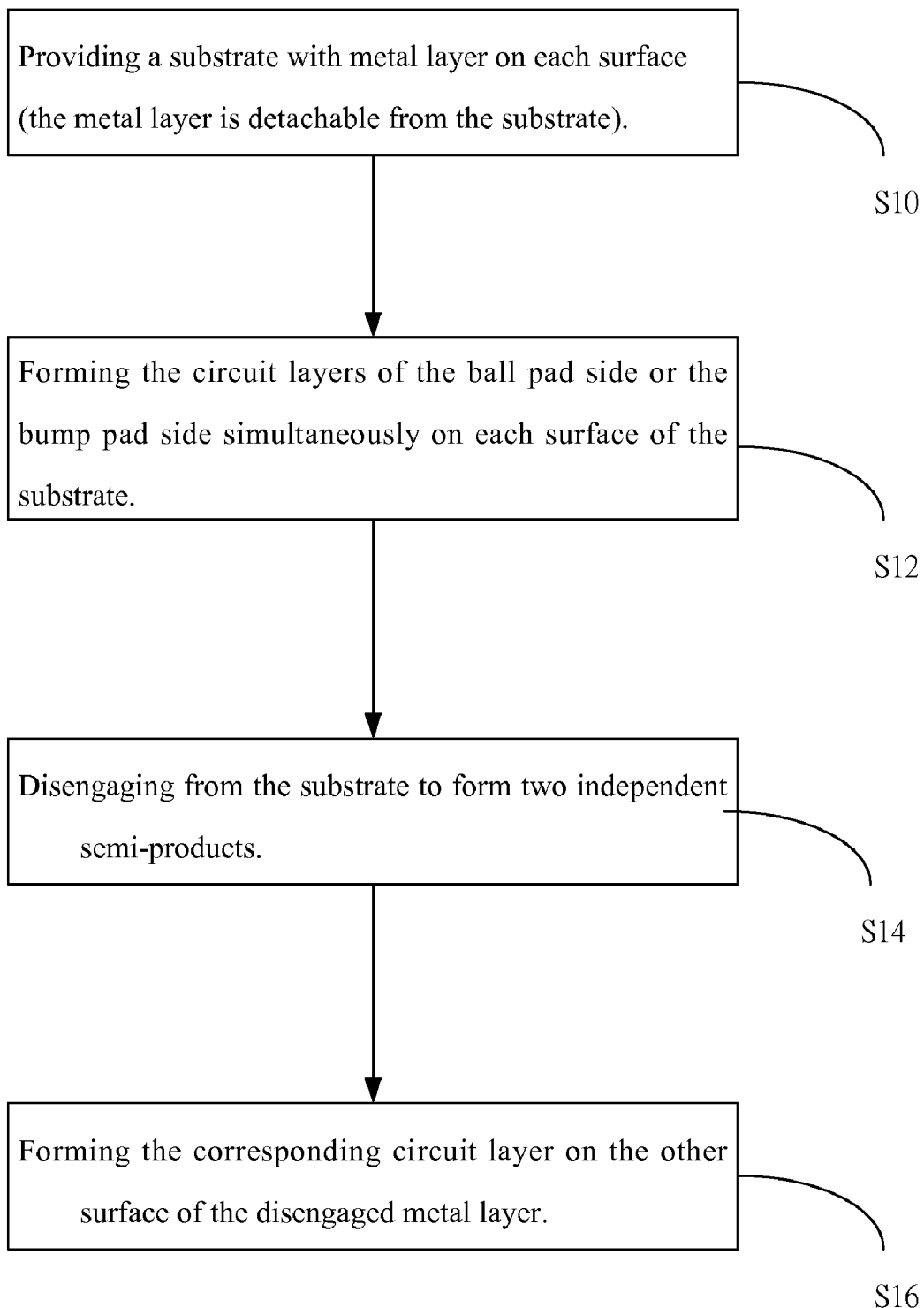
FIG. 1 is a flow chart showing the processing steps of manufacturing coreless substrates according to the present invention.
Figure 2:
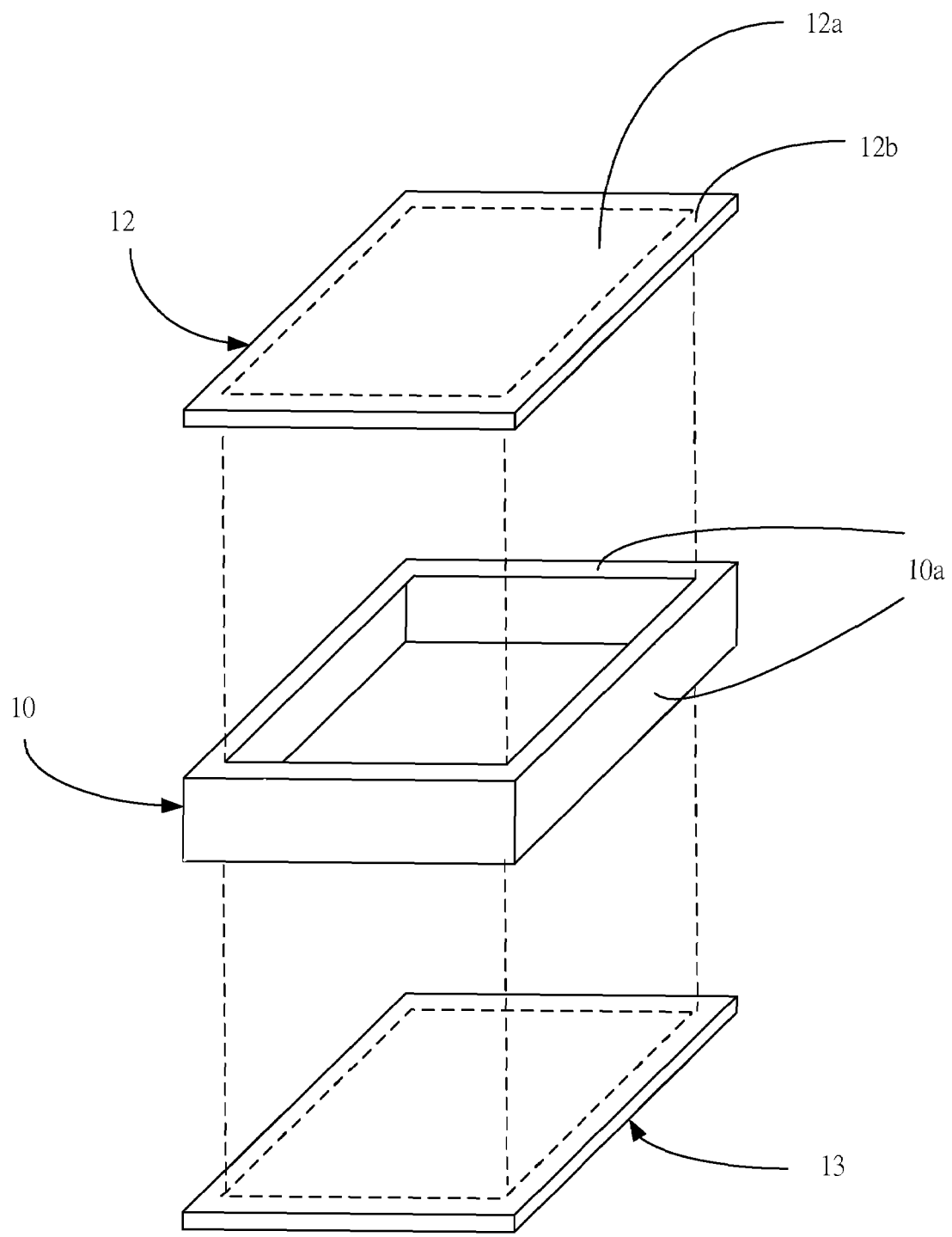
FIG. 2 is a perspective diagram showing the base used to manufacture the coreless substrate according to an embodiment of the present invention.
Figure 3A:
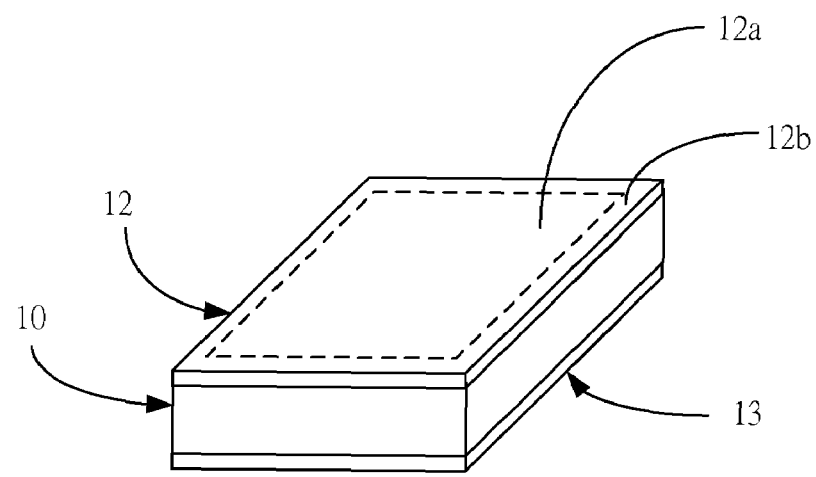
FIG. 3A is a perspective diagram showing the result after Step S10 of FIG. 1.

FIG. 1 shows a flow chart of the method for manufacturing coreless substrate according to the present invention. As shown in FIG. 1, in Step S10, a base having detachable metal layers on both top and bottom sides are provided. As shown in FIG. 2, an embodiment of the base has a hollow dielectric frame 10 with four side walls 10a made of a dielectric material. Two metal layers 12 and 13 cover the top and bottom sides of the dielectric frame 10, respectively. Each of the outer surfaces of the metal layers 12 and 13 is partitioned into a wiring area 12a and a rim area 12b surrounding the wiring area 12a. The wiring area 12a is where the wiring is formed and the rim area 12b will be removed in subsequent steps. The width of the rim area 12b is substantially conforming to the thickness of the side walls 10a. The result of joining the metal layers 12 and 13 to the dielectric frame 10 is shown in FIG. 3A.

Figure 3B:
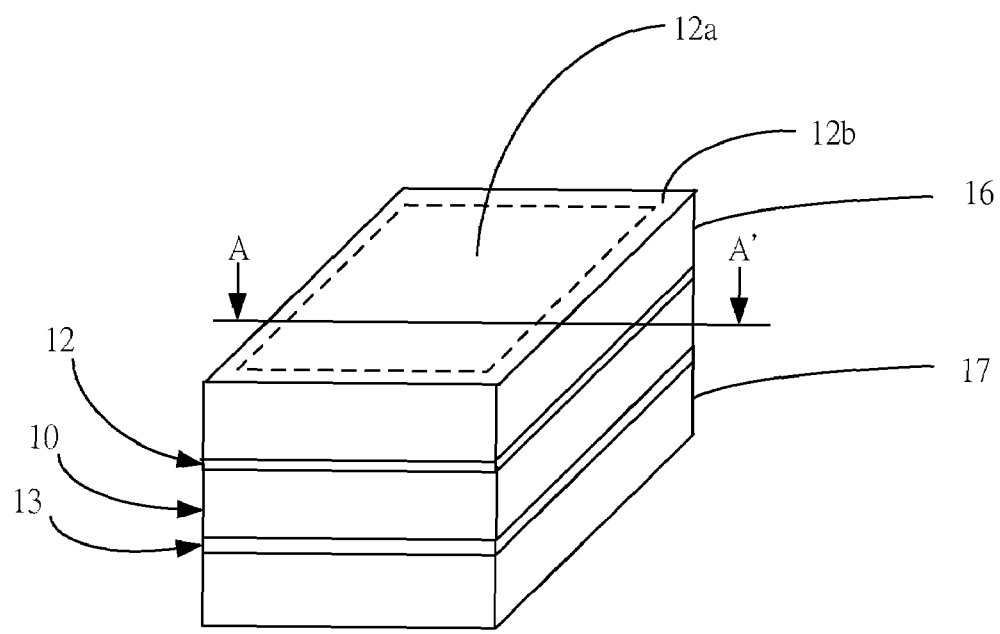
FIG. 3B is a perspective diagram showing the result after Step S12 of FIG. 1.

Then, in Step S12, wiring layers 16 and 17 are formed on the outer surfaces of the metal layers 12 and 13, respectively. Each of the wiring layers 16 and 17 functions as the bump-pad side or ball-side wiring layer of a coreless substrate. Please note that each of the wiring layers 16 and 17 also contains wiring area 12a and rim area 12b. Similarly, the width of the rim area 12b of either wiring layer 16 or 17 is substantially conforming to the thickness of the side walls 10a, as shown in FIG. 3B. Please note that the metal layers 12 and 13 are usually made of copper and are usually patterned in accordance with the wiring layers 16 and 17.

Figure 4A:
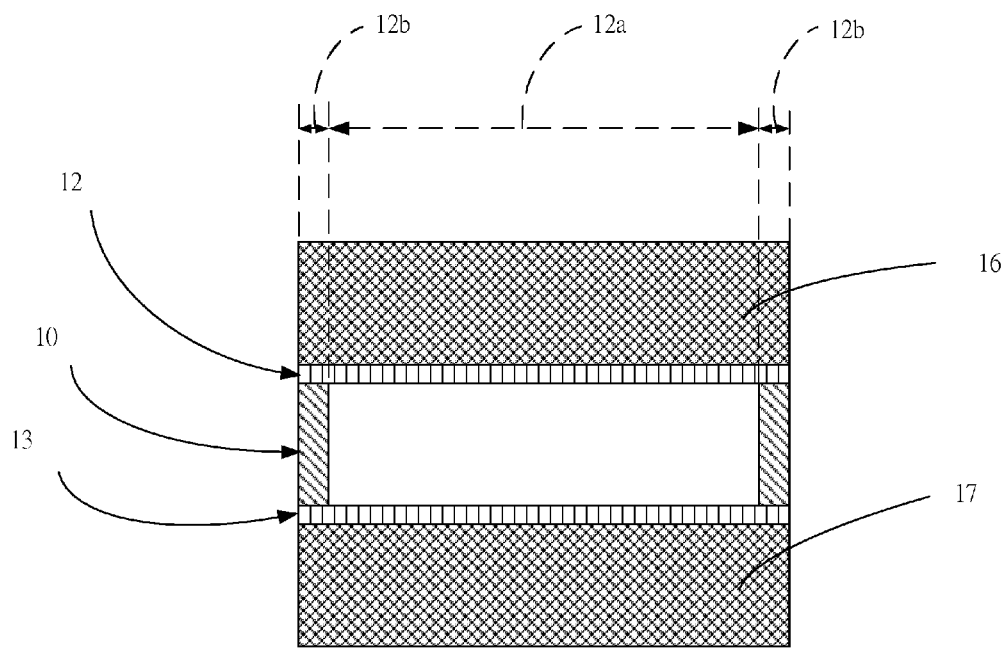
FIG. 4A is a sectional diagram of FIG. 3B.
Figure 4B:
FIGS. 4B~4C are sectional diagrams showing the results after Steps S14 and S16 of FIG. 1, respectively.

Then, in Step S14, the wiring layers 16 and 17 along with their respective metal layers 12 and 13 are separated from the base. As shown in FIG. 4A, which is a sectional diagram along the A-A' line of FIG. 3B, by cutting along the borders where the wiring areas 12a and rim areas 12b of the wiring layers 16 and 17 interface with each other. The rim areas 12b along with the side walls 10a of the dielectric frame 10 are therefore removed, leaving two semi-products of the coreless substrate as shown in FIG. 4B.

Figure 4C:
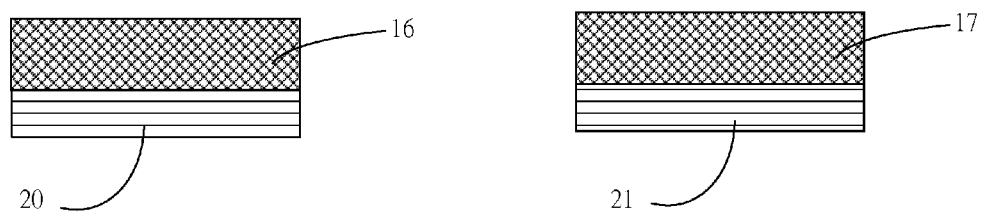

Then, in Step S16, on the other sides of the metal layers 12 and 13 opposite to the wiring layers 16 and 17, a number of wiring and/or resin layers 20 and 21 required by the coreless substrate are developed respectively. The result is two coreless substrates as shown in FIG. 4C. Please note that the metal layers 12 and 13 are not removed. Instead, they are part of the layers 20 and 21. According to the foregoing description, the present invention indeed not only achieves the fabrication of coreless substrates, but also can double the production capacity as two coreless substrates are produced at once in a single process.

As a brief summary, the major characteristic of the present invention lies in the provision of a base and two metal layers on the top and bottom sides that are detachable from the base. Then, from the two metal layers respectively, the bump-pad side or ball-side wiring layers of a coreless substrate are developed simultaneously. Then, the two metal layers along with their respective bump-pad side or ball-side wiring layers are separated from the base into two semi-products of the coreless substrate. Then, from the other side of the metal layers (i.e., opposite to the bump-pad side or ball-side wiring layers), the other wiring layers required by the coreless substrate are developed to complete the fabrication process. As such, two coreless substrates are manufactured at once in a single process.

Figure 5A:
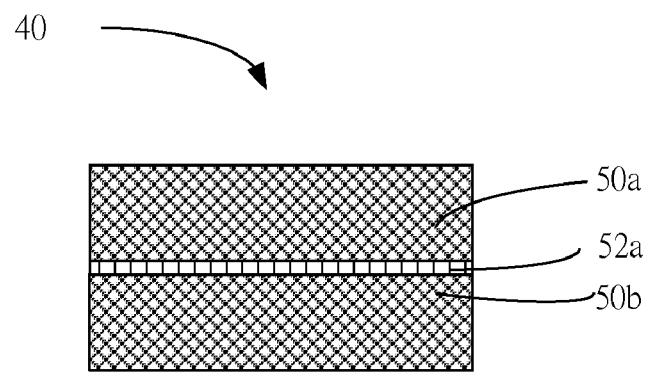
FIGS. 5A-5D are sectional diagrams showing the result after the processing steps of FIG. 1 according to another embodiment of the present invention.

Based on the same principle, FIGS. 5A~5D show another embodiment of the present invention. As shown in FIG. 5A, the base provided in Step S10 is an organic disengagement layer 52a and two copper foils 50a and 50b are adhered to its both sides. Due to the characteristic of the organic disengagement layer 52a, the copper foils 50a and 50b can later be separated in Step S14. The organic disengagement layer 52a can be implemented using various methods and quite a few techniques have already been disclosed in prior art. The details are therefore omitted here.

Figure 5B:
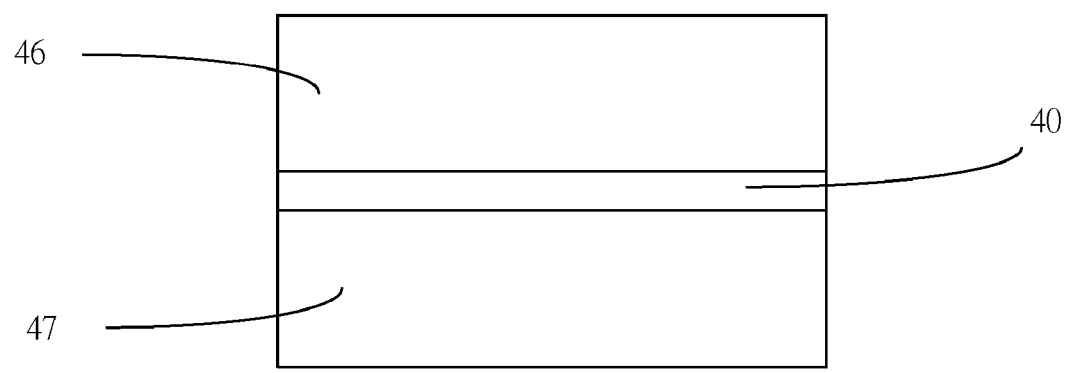
Figure 5C:
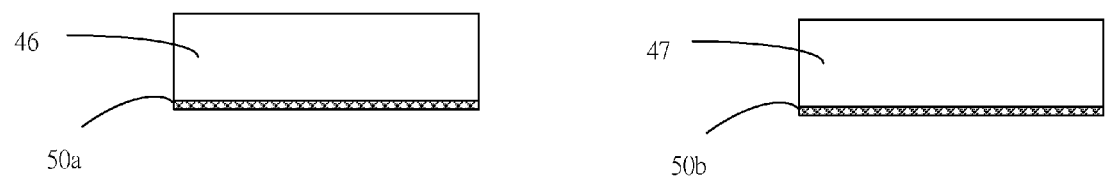
Figure 5D:
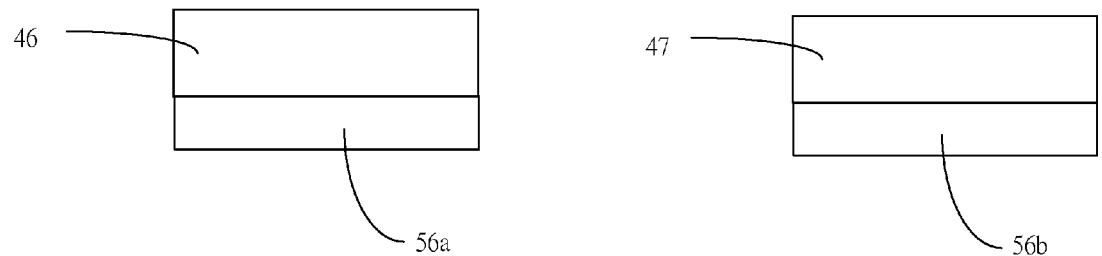

Then, in Step S12, wiring layers 46 and 47 are formed from the copper foils 50a and 50b respectively and simultaneously, as shown in FIG. 5B. Again, in Step S14, the copper foils 50a and 50b and their respective wiring layers 46 and 47 are separated from the organic disengagement layer 52a, as shown in FIG. 5C. Finally, in Step S16, from the other sides of the copper foils 50a and 50b, wiring layers 56a and 56b are developed respectively, as shown in FIG. 5D. Please note that, in FIG. 5D, the copper foils 50a and 50b are not removed but are part of the wiring layers 56a and 56b.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for manufacturing a coreless substrate, comprising the steps of:
    (1) providing a base and two metal layers, said two metal layers being joined to and covering top and bottom sides of said base respectively, said two metal layers being detachable from said base;
    (2) forming first wiring layers on outer surfaces of said metal layers respectively as a bump-pad side layer or a ball-side wiring layer required by said coreless substrate; and
    (3) separating said metal layers along with their respective first wiring layers from said base into two independent semi-products of said coreless substrate with inner surfaces of said metal layers being exposed; and
    (4) forming wiring layers required by said coreless substrate on the inner surfaces of said metal layers of said semi-products respectively;
    wherein said base is a hollow frame having four side walls made of a dielectric material.

2. The method as claimed in claim 1, wherein said metal layers and said first wiring layers have wirings formed within an area not overlapping said side walls.

3. The method as claimed in claim 2, wherein said metal layers along with their respective first wiring layers are separated from said base by cutting off said side walls, leaving said metal layers and said first wiring layers within said area.

4. The method as claimed in claim 1, wherein said base is an organic disengagement layer and said metal layers are copper foils detachable from said organic disengagement layer.

* * * * *